(12) United States Patent
Fang et al.

(10) Patent No.: US 11,238,579 B2
(45) Date of Patent: Feb. 1, 2022

(54) DEFECT PATTERN GROUPING METHOD AND SYSTEM

(71) Applicant: ASML Netherlands B.V., AH Veldhoven (NL)

(72) Inventors: Wei Fang, San Jose, CA (US); Haili Zhang, San Jose, CA (US); Zhichao Chen, San Jose, CA (US); Shengcheng Jin, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 16/479,138

(22) PCT Filed: Jan. 18, 2018

(86) PCT No.: PCT/EP2018/051162
§ 371 (c)(1),
(2) Date: Jul. 18, 2019

(87) PCT Pub. No.: WO2018/134286
PCT Pub. Date: Jul. 26, 2018

(65) Prior Publication Data
US 2019/0333205 A1    Oct. 31, 2019

Related U.S. Application Data

(60) Provisional application No. 62/616,420, filed on Jan. 11, 2018, provisional application No. 62/447,581, filed on Jan. 18, 2017.

(51) Int. Cl.
*G06T 7/00* (2017.01)
*G03F 7/20* (2006.01)
*G05B 19/406* (2006.01)

(52) U.S. Cl.
CPC ............ *G06T 7/001* (2013.01); *G03F 7/7065* (2013.01); *G05B 19/406* (2013.01); *G05B 2219/32222* (2013.01); *G06T 2207/30148* (2013.01)

(58) Field of Classification Search
CPC .......... G06T 7/001; G06T 2207/30148; G03F 7/7065; G05B 19/406; G05B 2219/32222; Y02P 90/02
See application file for complete search history.

(56) References Cited

U.S. PATENT DOCUMENTS

| | | | |
|---|---|---|---|
| 5,129,009 A | 7/1992 | Lebeau | |
| 7,765,515 B2 * | 7/2010 | Ying | G03F 1/36 716/52 |

(Continued)

FOREIGN PATENT DOCUMENTS

JP      2005-315792 A      11/2005

OTHER PUBLICATIONS

Office Action and Search Report issued from the Intellectual Property Office of ROC Taiwan Patent Application No. 107101929, dated Nov. 19, 2018 (25 pages).

(Continued)

*Primary Examiner* — Aaron W Carter
(74) *Attorney, Agent, or Firm* — Finnegan, Henderson, Farabow, Garrett & Dunner, LLP

(57) ABSTRACT

A defect pattern grouping method is disclosed. The defect pattern grouping method comprises obtaining a first polygon that represents a first defect from an image of a sample, comparing the first polygon with a set of one or more representative polygons of a defect-pattern collection, and grouping the first polygon with any one or more representative polygons identified based on the comparison.

18 Claims, 13 Drawing Sheets

(56) References Cited

U.S. PATENT DOCUMENTS

| | | | | |
|---|---|---|---|---|
| 2005/0198602 A1* | 9/2005 | Brankner | G03F 7/7065 | 382/151 |
| 2007/0052963 A1* | 3/2007 | Orbon | G03F 1/84 | 356/430 |
| 2007/0156379 A1* | 7/2007 | Kulkarni | G06F 30/30 | 703/14 |
| 2007/0230770 A1* | 10/2007 | Kulkarni | H01L 21/67005 | 382/149 |
| 2010/0215247 A1 | 8/2010 | Kitamura et al. | | |
| 2010/0226562 A1 | 9/2010 | Wu et al. | | |
| 2013/0170733 A1* | 7/2013 | Leu | G01N 21/9501 | 382/149 |
| 2013/0174102 A1* | 7/2013 | Leu | G05B 19/41875 | 716/52 |
| 2013/0336571 A1* | 12/2013 | Fu | G03F 1/84 | 382/144 |
| 2014/0343884 A1* | 11/2014 | Leu | H01L 22/12 | 702/82 |
| 2016/0377561 A1 | 12/2016 | Ramachandran et al. | | |
| 2017/0082555 A1* | 3/2017 | He | G06N 20/20 | |
| 2017/0186151 A1* | 6/2017 | Banerjee | G06T 7/0006 | |
| 2017/0345725 A1* | 11/2017 | Hu | G06T 7/001 | |
| 2019/0279914 A1* | 9/2019 | Saraswatula | H01L 22/12 | |
| 2019/0333205 A1* | 10/2019 | Fang | G05B 19/406 | |
| 2019/0370950 A1* | 12/2019 | Fang | G06T 7/001 | |
| 2020/0020092 A1* | 1/2020 | Fang | G06T 7/001 | |
| 2020/0334446 A1* | 10/2020 | Fang | G06K 9/00147 | |

OTHER PUBLICATIONS

International Search Report and Written Opinion dated May 11, 2018, for corresponding PCT International Application No. PCT/EP2018/051162 (3 pages).

* cited by examiner

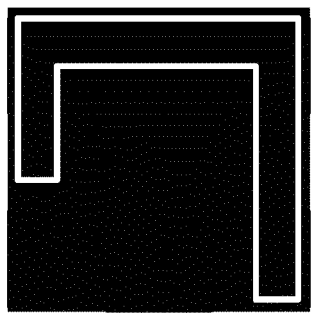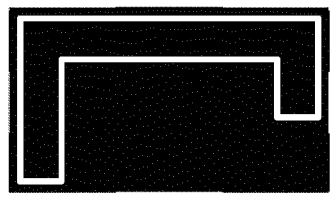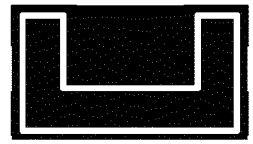
Fig. 7

DEFECT PATTERN GROUPING METHOD AND SYSTEM

CROSS-REFERENCE TO RELATED APPLICATIONS

This application is a national stage filing under 35 U.S.C. § 371 of International Application No. PCT/EP2018/051162, filed on Jan. 18, 2018, and published as WO 2018/134286 A1, which is based upon and claims priority to U.S. Provisional Application No. 62/447,581, filed Jan. 18, 2017 and entitled "GDS Pattern Grouping," and to U.S. Provisional Application No. 62/616,420, filed Jan. 11, 2018, and entitled "Defect Pattern Grouping Method," and these applications are incorporated herein by reference in their entireties.

TECHNICAL FIELD

The embodiments provided herein disclose a displaying method, and more particularly, a displaying method for defect reviewing in semiconductor fabrication operation process.

BACKGROUND

In various steps of a semiconductor manufacturing process, pattern defects can appear on a wafer, a chip, and/or a mask during the fabrication process, which can reduce the yield to a great degree. To meet the demand of high throughput and high yield of the manufacturing process, operators need to review a wafer, a chip, and/or a mask through a graphical user interface (GUI) displaying various patterns of objects under observation in display part of foundry equipment, and identify pattern defects at the earliest stage as possible.

Unfortunately, identifying pattern defects can take a substantial amount of an operator's time, thereby hurting throughput. To solve this problem, automatic defect classification system may be adopted to group identified defects into various defect types for operators' review to expedite the defect identification process.

SUMMARY

In some embodiments of the disclosure, a defect pattern grouping method is provided. The method comprises obtaining a first polygon that represents a first defect from an image of a sample, comparing the first polygon with a set of representative polygons of a defect-pattern collection, and grouping the first polygon with any one or more representative polygons identified based on the comparison.

In some embodiments of the disclosure, the defect pattern grouping method has the set of representative polygons of a defect-pattern collection is obtained from polygon patterns of the set of representative polygons of a defect-pattern collection. In some other embodiments of the disclosure, the defect pattern grouping method has the set of representative polygons of a defect-pattern collection is obtained from topological characteristic of the polygon patterns of the set of representative polygons of a defect-pattern collection.

In some embodiments of the disclosure, a non-transitory computer readable medium is disclosed. The computer readable medium stores a set of instructions that is executable by one or more processors of a defect classification server to cause the server to perform a method. The method comprises obtaining a first polygon that represents a first defect from an image of a sample, comparing the first polygon with a set of representative polygons of a defect-pattern collection, and grouping the first polygon with any one or more representative polygons identified based on the comparison.

BRIEF DESCRIPTION OF FIGURES

FIG. 7 is a schematic diagram illustrating multiple exemplary polygons sharing a same structure to be classified into a same group, consistent with embodiments of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

To facilitate and speed up the defect pattern identifying process, during the defect review process, defects on semiconductor wafers are automatically identified and classified into various defect types. While the defect classification can be performed automatically, user's intervention is always required to confirm that defects identified are correctly sorted and grouped. Therefore, the disclosed embodiments provide a way to efficiently identify defects for display to operators, thereby improving the efficiency of the defect identification process and the throughput of the manufacturing process.

The embodiments described herein provide a method to classify defects identified on an image of a wafer based on their graphical information. Traditional defect classification methods normally utilize grayscale image information, which may lead to wrong classification for some particular defect types, for instance, large pattern broken, pattern missing, etc. On the contrary, these scenarios seldom appear in graphic-based classification methods as the graphical layout information is intact.

In graphic-based classification, each defect has its own graphic patch, which can assist with defect classifications. Each graphic patch can be a set of one or more polygons. Graphic patches can be grouped based on a determined similarity between two graphic patches. For example, similarity can be measured by taking on values between 0 and 1, with 0 representing completely different patches while 1 represents the patches being identical.

Figure 1:
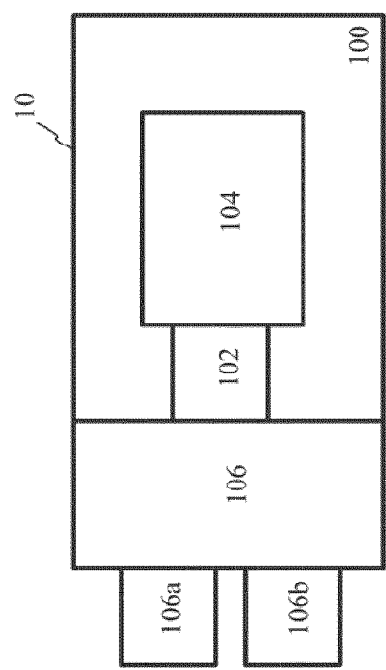
FIG. 1 is a schematic diagram illustrating an exemplary electron beam inspection (EBI) system, consistent with embodiments of the present disclosure.

Reference is now made to FIG. 1, which is a schematic diagram illustrating an exemplary electron beam inspection (EBI) system, consistent with embodiments of the present disclosure. FIG. 1 illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer cassettes that contain wafers (e.g., semiconductor wafers or wafers made of other material(s)) or samples to be inspected (wafers and samples are collectively referred to as "wafers" hereafter). One or more robot arms (not shown) in EFEM 106 transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104.

Figure 2:
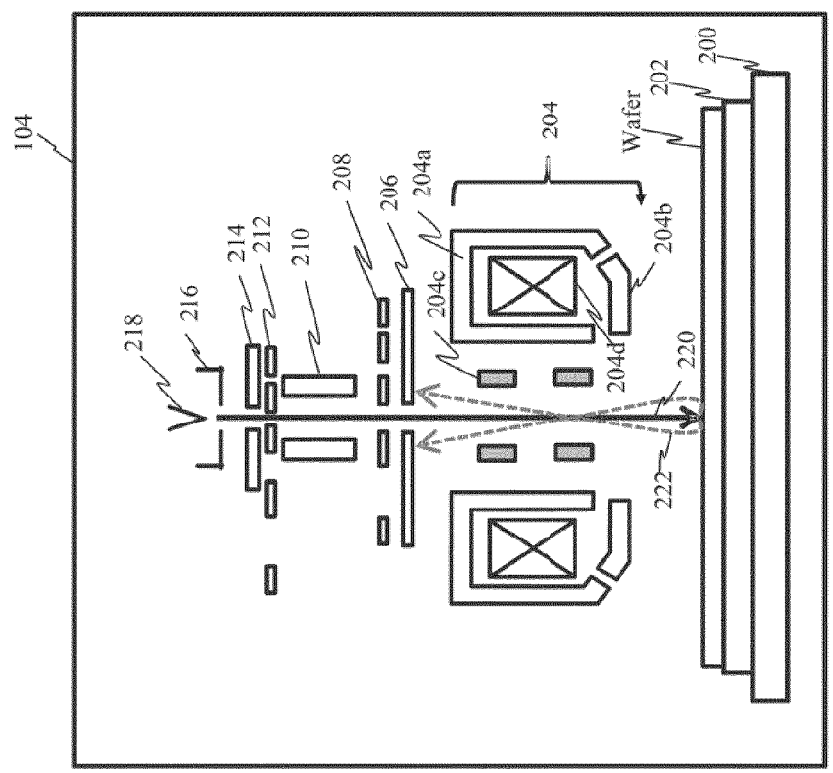
FIG. 2 is a schematic diagram illustrating an exemplary electron beam tool that can be a part of the exemplary electron beam inspection of FIG. 1, consistent with embodiments of the present disclosure.

Reference is now made to FIG. 2, which is a schematic diagram illustrating an exemplary electron beam tool that can be a part of the exemplary electron beam inspection of FIG. 1, consistent with embodiments of the present disclosure. FIG. 2 illustrates exemplary components of electron beam tool 104, consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in one embodiment, can include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c can be controlled to deflect primary electron beam 220 sequentially onto different locations of top surface of wafer 203 at different time points, to provide data for image reconstruction for different parts of wafer 203. Moreover, deflector 204c can also be controlled to deflect primary electron beam 220 onto different sides of wafer 203 at a particular location, at different time points, to provide data for stereo image reconstruction of the wafer structure at that location. Further, in some embodiments, anode 216 and cathode 218 can be configured to generate multiple primary electron beams 220, and electron beam tool 104 can include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 can be immersed in the magnetic field and can be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary electron beam 222 can be emitted from the part of wafer 203 upon receiving primary electron beam 220. Secondary electron beam 222 can form a beam spot (e.g., one of beam spots 240a and 240b) on sensor surfaces 206a and 206b of electron detector 206. Electron detector 206 can generate a signal (e.g., a voltage, a current, etc.) that represents an intensity of the beam spot, and provide the signal to a processing system (not shown in FIG. 2). The intensity of secondary electron beam 222, and the resultant beam spot, can vary according to the external and/or internal structure of wafer 203. Moreover, as discussed above, primary electron beam 220 can be projected onto different locations of the top surface of the wafer, and/or different sides of the wafer at a particular location, to generate secondary electron beams 222 (and the resultant beam spot) of different intensities. Therefore, by mapping the intensities of the beam spots with the locations of wafer 203, the processing system can reconstruct an image that reflects the internal and/or external structures of wafer 203.

Figure 3:
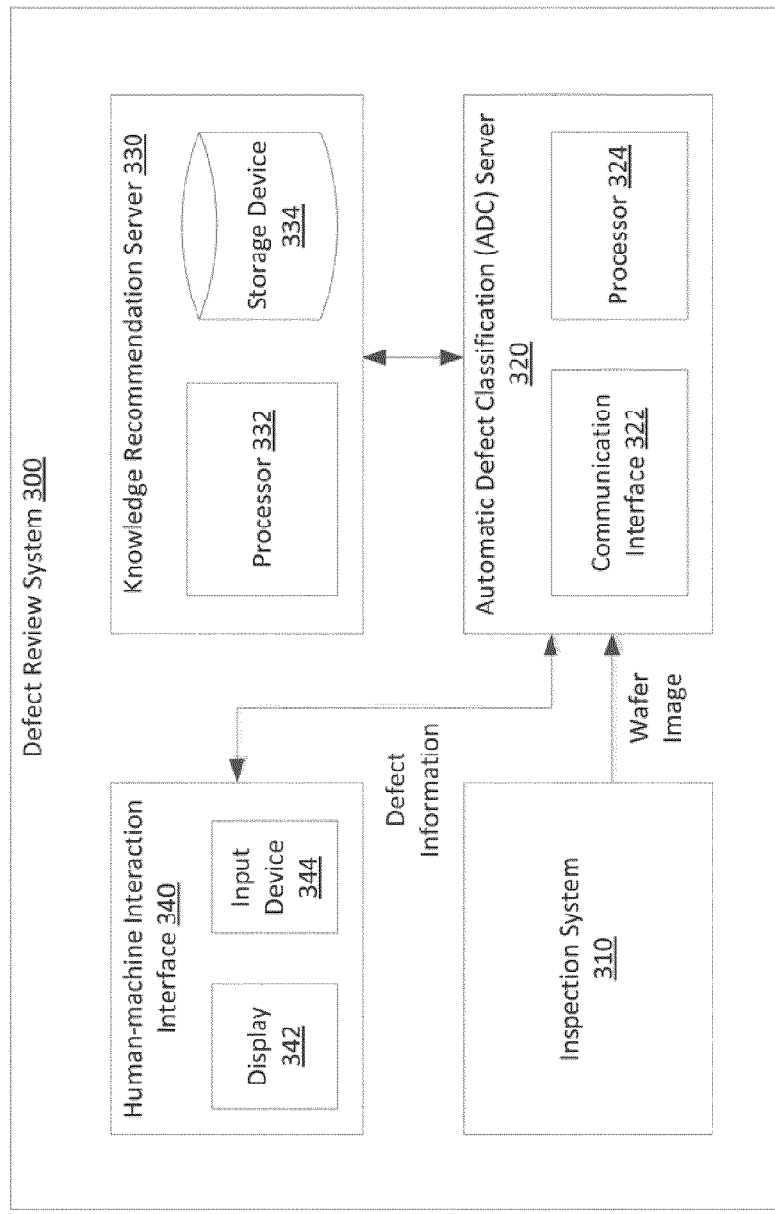
FIG. 3 is a block diagram illustrating an exemplary defect review system, consistent with embodiments of the present disclosure.

Reference is now made to FIG. 3, which is a block diagram illustrating an exemplary defect review system, consistent with embodiments of the present disclosure. Once a wafer image is acquired, the wafer image may be transmitted to a computer system where the system can identify defects on the wafer image, and classify the defects into categories according to the type of the defects. Defect information is further displayed in a display part of a human-machine interaction interface and operators' feedback can be collected through an input device of the human-machine interaction interface.

Referring to FIG. 3, defect review system 300 includes a wafer inspection system 310, an Automatic Defect Classification (ADC) server 320, a knowledge recommendation server 330 electrically coupled to ADC server 320, and a human-machine interaction interface 340 electrically couple to ADC server 320. Wafer inspection system 310 can be electron beam inspection (EBI) system 100 described with respect to FIG. 1. It is appreciated that ADC server 320, knowledge recommendation server 330, and human-machine interaction interface 340 can be part of and/or remote from EBI system 100.

Wafer inspection system 310 can be any inspection system that can generate an inspection image of a wafer. The wafer can be a semiconductor wafer substrate, or a semiconductor wafer substrate having one or more epi-layers and/or process films. Wafer inspection system 310 can be any currently available or developing wafer inspection system. The embodiments of the present disclosure does not limit the specific type for wafer inspection system 310 as long as it can generate a wafer image having a resolution high enough to observe key features on the wafer (e.g., less than 20 nm), consistent with contemporary semiconductor foundry technologies.

ADC server 320 has a communication interface 322 that is electrically coupled to the wafer inspection system 310 to receive the wafer image. ADC server 320 also includes a processor 324 that is configured to analyze the wafer image, and detect and classify wafer defects that appear on the wafer image by using a defect knowledge file. The defect knowledge file can be manually provided to ADC server 320 by an operator. Alternatively, the defect knowledge file can be automatically provided to ADC server 320 by knowledge recommendation server 330, which will be described in detail below.

Knowledge recommendation server 330 is electrically coupled to ADC server 320. Knowledge recommendation server 330 includes a processor 332 and a storage device 334. Processor 332 is configured to build a plurality of defect knowledge files, and store the plurality of defect knowledge files in storage device 334.

The plurality of defect knowledge files contains information related to various types of defects generated during various stages of a wafer manufacturing process. The various stages of a wafer manufacturing process may include, but is not limited to, a lithography process, an etching process, a chemical mechanical polishing (CMP) process, and an interconnection forming process. Defects generated in the lithographic process may include, but are not limited to, photoresist (RP) residue defects due to PR deterioration or impurity, peeling defects, bridge defects, bubble defects, and dummy pattern missing defects due to pattern shift. Defects generated in an etching process may include, but are not limited to, etching residue defects, over-etching, defects and open circuit defect. Defects generated in a CMP process may include, but are not limited to, slurry residue defects, dishing defects, and erosion defects due to variance in polishing rates, and scratched due to polishing. Defects generated in an interconnection forming process may include, but are not limited to, broken line defects, void defects, extrusion defects, and bridge defects.

Processor 332 is configured to build the plurality of defect knowledge files based on a plurality of defect patch images. The plurality of defect patch images can be generated by a wafer inspection tool, such as electron beam tool 104 illustrated in FIG. 2. A defect patch image is a small image (e.g., 34×34 pixels) of a portion of the wafer that contains a defect. The defect patch image is usually centered on the defect, and includes neighboring pixels of the defect.

Human-machine interaction interface 340 is electrically couple to ADC server 320. Human-machine interaction interface 340 includes at least a display 342 and an input device 344. Human-machine interaction interface 340 is built to exchange defect and defect classification information between defect review system 300 and operators.

Once a knowledge file is chosen, processor 324 of ADC server 320 processes wafer images sent from inspection system 310 and identifies defects generated in various semiconductor manufacturing processes. Identified defects are sent to a display 342 of a human-machine interaction interface 340 for displaying defect information to operators for review and confirmation. If any discrepancies or mistakes of classification of defects are observed by an operator, an input device 344 can be used to provide feedback defect information to ADC server 320 through human-machine interaction interface 340.

It is appreciated that display 342 can be any type of a computer output surface and projecting mechanism that shows text and graphic images, including but not limited to, cathode ray tube (CRT), liquid crystal display (LCD), light-emitting diode (LED), gas plasma, a touch screen, or other image projection technologies, for displaying information to a computer user. It is also appreciated that input device 344 can be any type of a computer hardware equipment used to provide data and control signals from an operator to defect review system 300. Input device 344 may include, but is not limited to, a keyboard, a mouse, a scanner, a digital camera, a joystick, a trackball, cursor direction keys, a touchscreen monitor, or audio/video commanders, etc., for communicating direction information and command selections to processor and/or for controlling cursor movement on display. The input device typically has two degrees of freedom in two axes, a first axis (for example, x) and a second axis (for example, y), that allows the device to specify positions in a plane.

Figure 4:
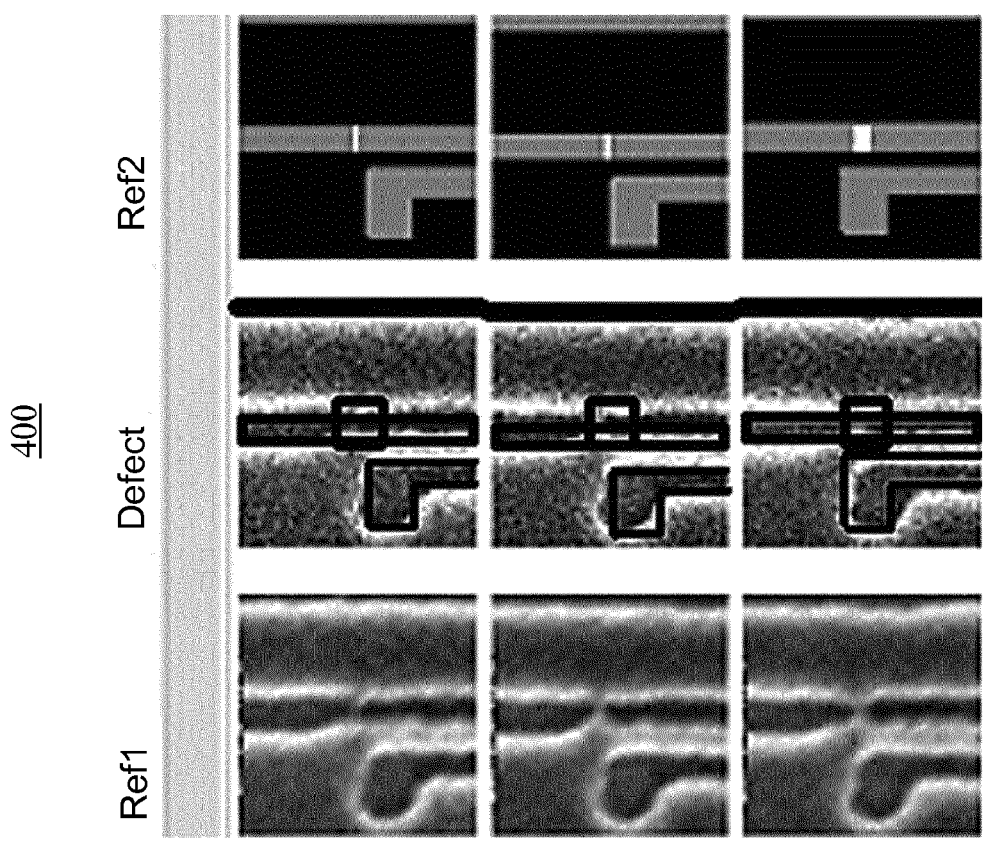
FIG. 4 is a chart illustrating an exemplary user interface to compare defects for defects grouping in a defect review system, consistent with embodiments of the present disclosure.

Reference is now made to FIG. 4, which is a chart illustrating an exemplary user interface to compare defects for defects grouping in a defect review system, consistent with embodiments of the present disclosure. Comparison of defects for the purpose of defect classification is executed in a defect review system. As an example, user interface 400 can be shown in display 342 of defect review system 300 and may display multiple defects (three defects as shown in FIG. 4) with each defect placed between a reference defect image at the left (Ref1) and a reference defect patch at the right (Ref2). Basically, a die-to-die defect comparison can be conducted by placing and displaying defect images this way.

The defect images shown in the middle column (under the Defect column) are based on a scanning electron microscopy (SEM) image. The SEM image can be captured by an EBI system and obtained by a defect review system. On top of the SEM image are lines outlining multiple polygons representing the image. These lineate polygons constitute a graphic patch of the defect shown in the SEM image. Because each defect has its own graphic patch, the graphic patch can be used to identify and classify defects.

The die image shown under the Ref1 column and left of the defect image under inspection can be an image of the same type of defect that is stored in the defect review system for the purpose of defect comparison and classification. This die image could be a die image from a previously identified defect showing typical geometrical characteristics of a defect of its kind. The displaying of empirical die image (under column Ref1) and die image under inspection (under column Defect) side by side can make the process of defect reviewing easier and faster. This comparison is considered to be a die-to-die comparison.

The lineate drawing shown under column Ref2 and to the right of the defect image under inspection can be a defect graphic patch image that is stored in the defect review system for the purpose of defect comparison and classification. This graphic patch image can be one or more polygons. And the patch image shown under column Ref2 is considered to be lineate image that best represents geometrical characteristics of a defect of its kind. The displaying of the graphic patch image and die image under inspection side by side can make the process of defect review easier and faster. The comparison is considered to be a die-to-database comparison.

Figure 5:
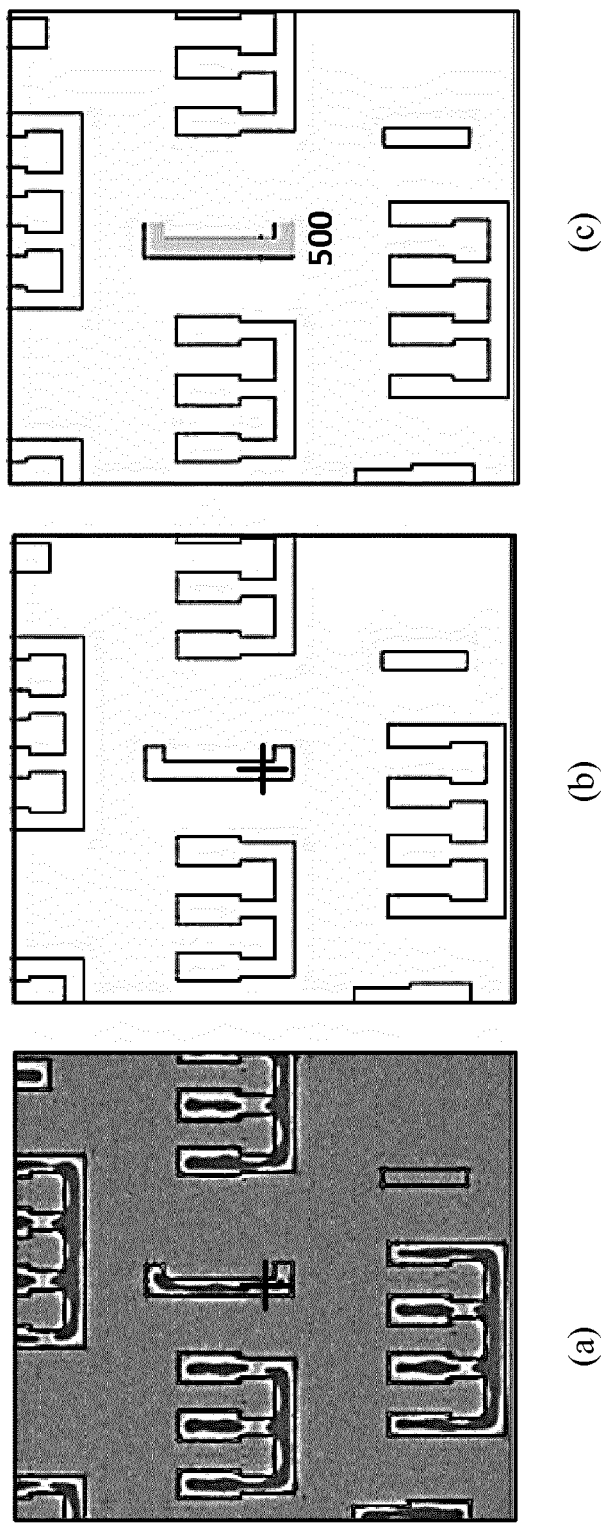
FIG. 5 is a schematic diagram illustrating an exemplary display interface for defect grouping for review of operators, consistent with embodiments of the present disclosure.

Reference is now made to FIG. 5, which is a schematic diagram illustrating an exemplary display interface for defect grouping for review of operators, consistent with embodiments of the present disclosure. Three die images of one defect are shown in a line side by side. Image (a) is an SEM image of one or more defects of a sample under inspection with graphic patch aligned on top of it, image (b) is a graphic patch image of the one or more defects of the same types of defect as the SEM image, and image (c) is a defect central polygon image obtained from the graphic pattern data. As mentioned, graphic patch can be viewed as a set of polygons, one of the most important polygons out of the set of polygons is a central polygon 500 because it is the center of the pattern of the one or more defects. In some scenarios, the central polygons are of a greater concern. Therefore, a classification purely based on the central polygon can be made first. It is appreciated that neighboring polygons around the central polygon may also be important. In some embodiments, when neighboring polygons are of vital importance, the neighboring graphical information is taken into consideration as well, and a second stage grouping is to be done.

There are more than one way to mathematically quantify the similarity between graphic patches for an accurate defect classification. In the following embodiments of the disclosure, polygon pattern grouping, topological pattern grouping, central polygon grouping, and second-step grouping are disclosed in detail.

Figure 6:
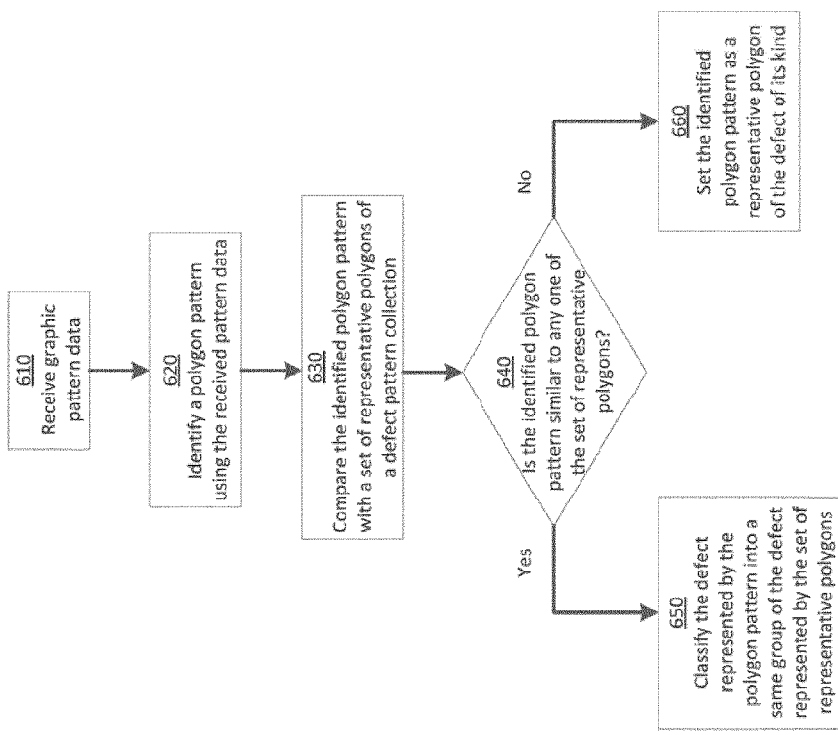
FIG. 6 is a chart illustrating an exemplary polygon pattern grouping process, consistent with embodiments of the present disclosure.

Reference is now made to FIG. 6, which is a chart illustrating an exemplary polygon pattern grouping process, consistent with embodiments of the present disclosure.

In polygon pattern grouping process, a polygon associated with a defect is used to do the defect classification. The polygon associated with a defect can be a central polygon of the defect. The polygon associated with the defect is to be compared with a set of representative polygons of a defect-pattern collection in the process. And a similarity between the polygon and the set of representative polygons is obtained for the purpose of defect classification. With a polygon pattern grouping set, a unique polygon search within the entire graphic area or a user-defined scanning area can be done to identify defects with at least a similar graphic pattern.

At step 610, graphic pattern data of an area under inspection is received. Thereafter, a search of defects with polygon patterns is conducted at step 620. Through the search, a polygon pattern with graphical information associated with a defect is identified. The polygon pattern can provide a general idea about the pattern included in the graphical information associated with a defect. At step 630, the identified polygon pattern associated with a defect is compared with a set of representative polygons of a defect-pattern collection. The collection of defect patterns represented by multiple representative polygons can be stored in a storage device electrically connected with defect classification server 320 or a storage/memory part of defect classification server 320. The multiple representative polygons of defect-pattern collection can be collected in precedent defect classification processes.

Classification of defects into a group of defects can be determined based on similarity between the identified polygon pattern and the representative polygons of defect-pattern collection. If the identified polygon pattern is similar to any one of the set of representative polygons, which means the identified polygon shows similar graphical information with the representative polygon, the defect represented by the identified polygon pattern is classified into a same group of defects represented by the representative polygon at step 650. Or if the identified polygon pattern is not similar to any one of the set of representative polygons, at step 660, the identified polygon pattern associated with the defect under inspection is set to be the representative polygon of the defect of its kind and is different from the representative polygons it was compared to at step 630.

Reference is now made to FIG. 7, which is a schematic diagram illustrating multiple exemplary polygons sharing a same structure to be classified into a same group, consistent with embodiments of the present disclosure.

In some embodiments, determining a graphic pattern based on defects with central polygons can be overly strict, if only polygon patterns have similar shape and size with the set of representative polygons of a defect-pattern collection are classified into a same group. In these embodiments, defect patterns' internal topological structure is of concern as well. Further, in some other embodiments, only shape, but not size, of a defect matters. It is appreciated that internal topological structure can include a number of sides, a direction of the sides, direction of topology, skeleton, etc. Number of sides and direction of sides can be considered to be critical internal topological structure parameters. Size of a pattern can include dimensions of polygon, length, width, depth/growth, etc. However, the setting of internal topological structure parameters and whether size is of concern can be determined by users of a defect review system. Parameters listed here are for explanation purposes only and are neither limiting nor exclusive. FIG. 7 shows such a scenario that all polygons have similar structure, e.g., three sides and two right angles, although each one of the polygons has a different size and different dimensions of sides, or the alike. In some embodiments, these polygons can be certainly classified into a single group of defects, while in other embodiments they can be classified into different groups of defects.

Figure 8:
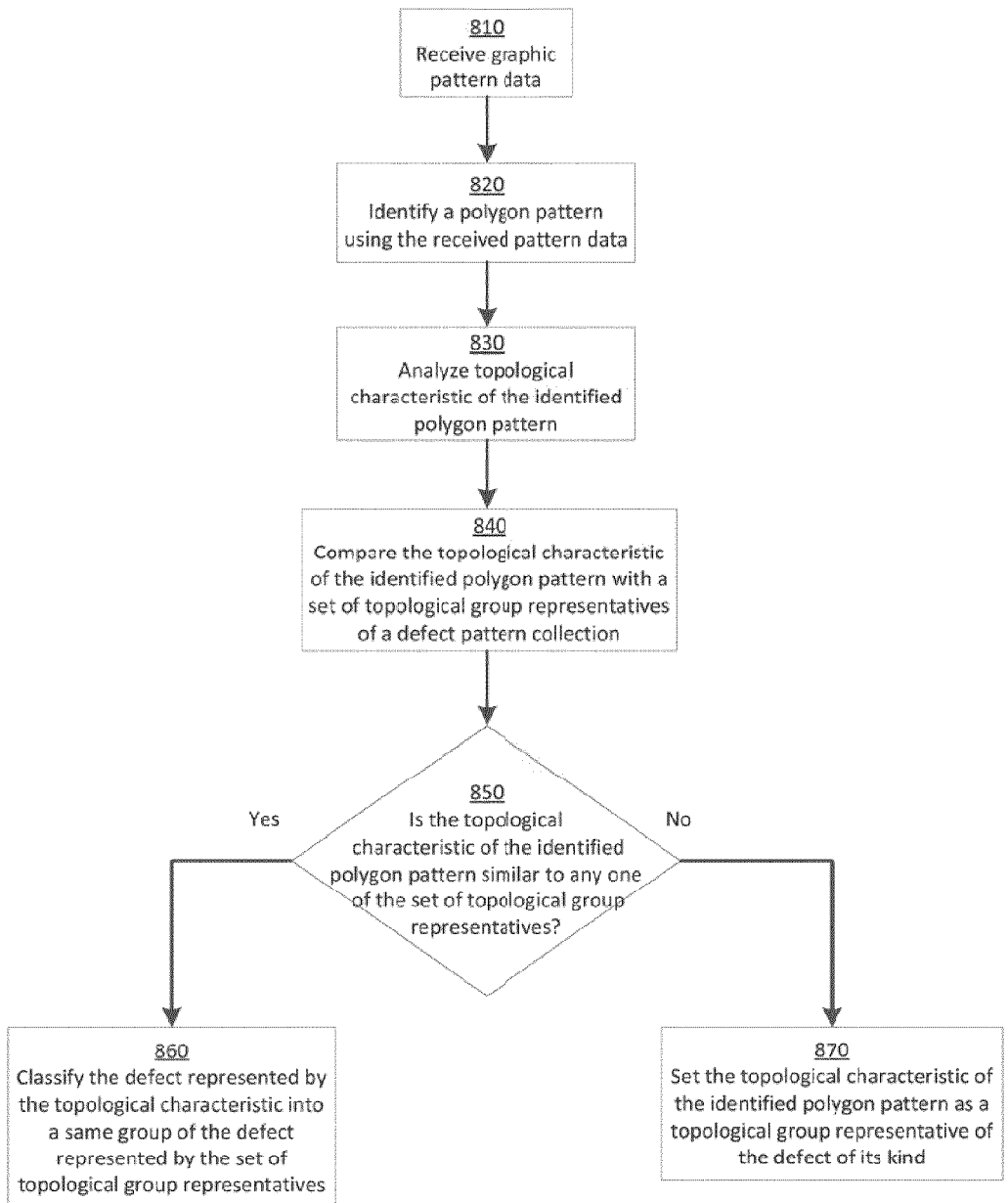
FIG. 8 is a chart illustrating an exemplary topological pattern grouping process, consistent with embodiments of the present disclosure.

Reference is now made to FIG. 8, which is a chart illustrating an exemplary graphic topological pattern grouping process, consistent with embodiments of the present disclosure. FIG. 8 shows a graphic topological pattern grouping process that shares a few similar steps to the process of a graphic pattern grouping.

At step 810, graphic information of an area under inspection is received. Thereafter, a search of defects with polygon patterns is conducted at step 820. Through the search, a polygon pattern with graphical information associated with a defect is identified. At step 830, a topology analysis is then conducted. Topological characteristic of the identified polygon pattern is obtained. The topological characteristic of the polygon pattern can provide a general idea about the structure of the pattern included in the graphical information associated with a defect. The obtained topological characteristic of the identified polygon pattern associated with a defect is then compared with a set of topological group representatives of a defect-pattern collection at step 840. The collection of defect patterns represented by multiple topological group representatives can be stored in a storage device communicatively connected with defect classification server 320 or a storage/memory part of defect classification server 320. The multiple topological group representatives of defect-pattern collections can be collected in precedent defect classification processes.

At step 850, a similarity rate between the topological characteristic(s) of the identified polygon pattern associated with a defect and the set of topological group representatives is calculated. Users of the defect review system can define a similarity threshold value before the process. If the calculated similarity rate is decided to be greater than the preset similarity threshold at step 850, the identified defect can be classified into a same group of defects represented by the topological group representative at step 860. Or if the calculated similarity rate is decided not to be greater than the preset similarity threshold at step 870, the topological characteristic of the second defect is set as the topological group representative of the defect of its kind, which is different from the topological group representatives it was compared to at step 840.

Figure 9:
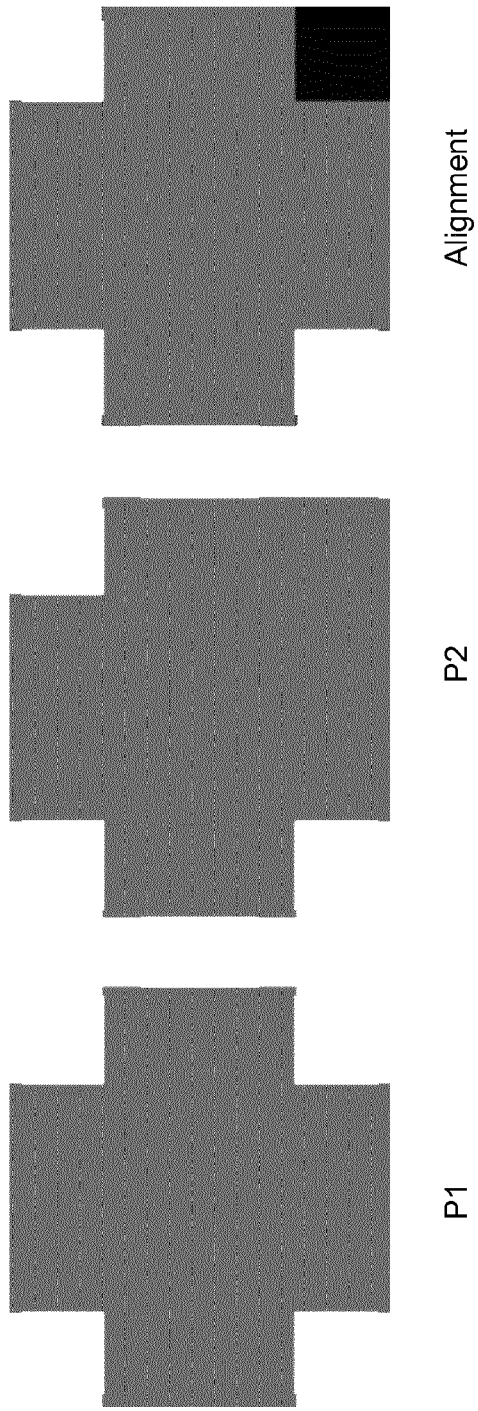
FIG. 9 is a schematic diagram illustrating two exemplary polygons and an overlapping image for determining similarity, consistent with embodiments of the present disclosure.

Reference is now made to FIG. 9, which is a schematic diagram illustrating two exemplary polygons and an overlapping image for determining similarity, consistent with embodiments of the present disclosure.

For some embodiments, the graphic grouping method can result in too many groups since the grouping method can be very strict. On the other hand, graphic topological grouping may lead to fewer groups because the grouping method is overly loose as it considers pattern shape only without consideration of size and dimension. In some scenarios, to balance these two methods, an area-based grouping method can be adopted.

To quantify the similarity between two graphic patches using the area-based grouping method disclosed in the following embodiments is explained with exemplary polygons P1 and P2 shown in FIG. 9. First, P1 and P2 are grouped into a same topological group because of their close internal topological structure. Note that although P1 and P2 have very close internal topological structures, they do not have exactly similar internal topological structures, for example, same number of sides, identical direction of sides, etc. Again, the setting of internal topological structures to be classified into one group is determined by users of the defect review system.

Second, an alignment between polygons P1 and P2 with maximum overlapped area is obtained by shifting one of the polygons back and forth, rotating, flipping, or any other possible geometrical movements, or a combination thereof if necessary. The step of aligning stops when the overlapped area between the two polygons reaches its maximum value. Similarity can be defined to be the ratio of the overlapped area over a union area, which is the total area occupied by the two polygons when they are maximally aligned. An area-based similarity rate can be any value from 0 to 1. The cutoff line between similarity and dissimilarity, i.e., the similarity threshold, is determined by users of the defect review system and could be any value from 0 to 1 as well, e.g., 0.7. As an example, any two polygons having an area-based similarity ratio greater than or equal to 0.7 can be classified to be in a same group.

Figure 10:
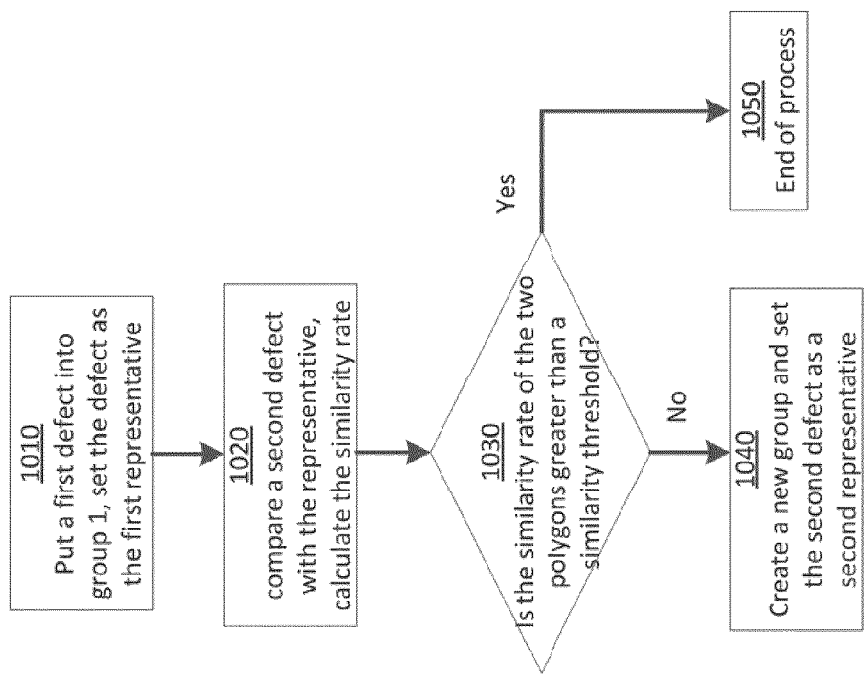
FIG. 10 is a flowchart illustrating an exemplary area-based similarity central polygon grouping process, consistent with embodiments of the present disclosure.

Reference is now made to FIG. 10, which is a flowchart illustrating an exemplary area-based similarity central polygon grouping process, consistent with embodiments of the present disclosure. At step 1010, a first defect is defined as defect classification group 1 and the graphic data of the first defect is set to be the representative graphical information. When a second defect image is received by the defect review system, similarity of the second defect is compared to the representative graphical information of the first defect at step 1020. Moreover, similarity value of the second defect against the representative graphical information is calculated and at step 1030, the similarity rate is determined whether to be greater than a user-defined similarity threshold. If the similarity value of the second defect against the representative graphical information is greater than the similarity threshold, the second defect is classified to be in the same group as the first defect and the process ends at step 1050.

If the similarity value of the second defect against the representative graphical information is equal to or less than the similarity threshold, the second defect is defined as a defect classification group 2 and the graphic data of the second defect is set to be the representative graphic data of the group at step 1040. Group 2 is created in the DGS database. The area-based similarity central polygon grouping process can be repeated until all defects identified in the area under inspection run out. It is appreciated that in some embodiments, when the similarity value of the second defect against the representative graphical information is equal to the similarity threshold, the second defect can be assigned to the same group as the first defect.

Figure 11:
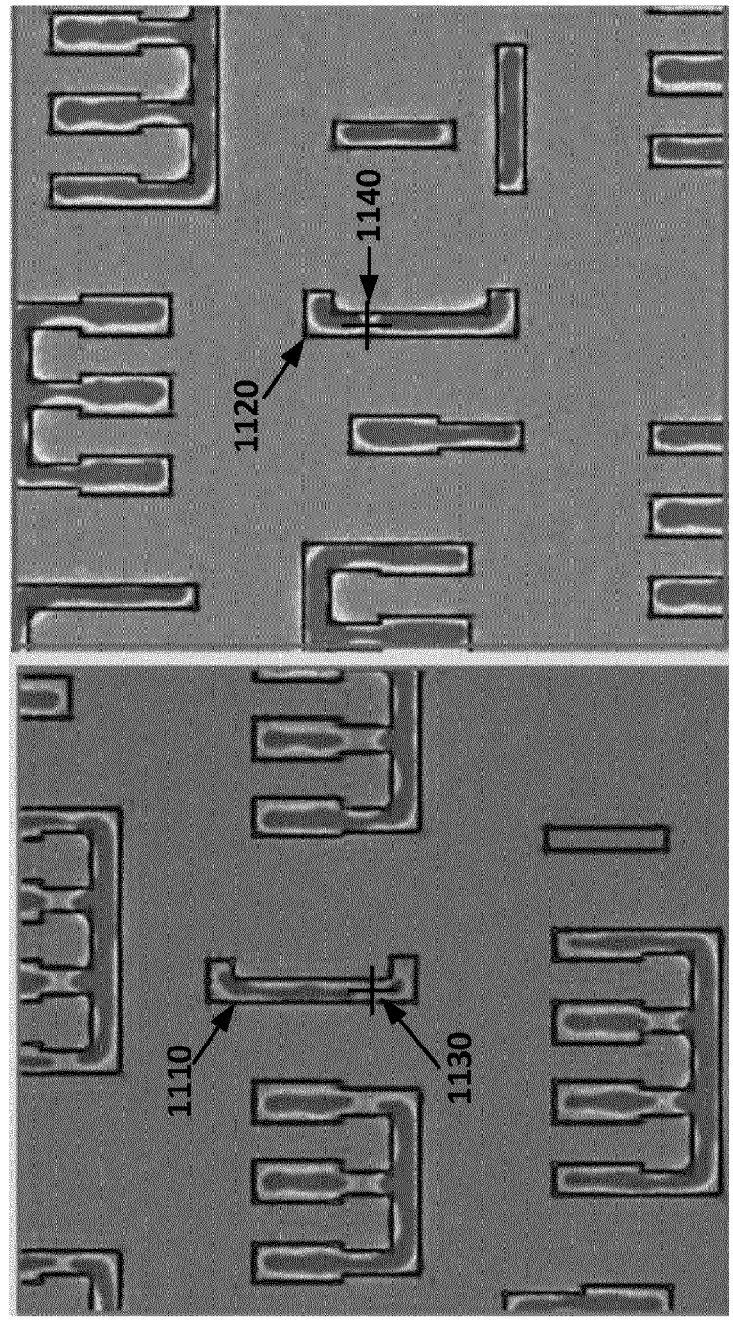
FIG. 11 is a schematic diagram illustrating two exemplary polygons sharing a same structure but different neighboring pattern information, consistent with embodiments of the present disclosure.

Reference is now made to FIG. 11, which is a schematic diagram illustrating two exemplary polygons 1110 of FIGS. 11(a) and 1120 of FIG. 11(b) sharing a same structure but different neighboring pattern information, consistent with embodiments of the present disclosure. Graphic pattern grouping methods disclosed in the foregoing embodiments are central polygon based. That is, the central polygon can be identified based on whether the polygon is centered within a portion of an image of the wafer, or is selected by an operator to be the polygon that is focused on. It appreciated that an indicator (such as indicators 1130 and 1140) can provide a center point of the portion of the image.

It is possible that two central polygons (such as polygons 1110 and 1120) belonging to the same group of defects can have different neighboring pattern information because they are classified into the same group only based on their central polygons. For instance, central polygons 1110 and 1120 of the defect image-graphic patch of FIG. 11(a) and the right defect image-graphic patch of FIG. 11(b) in are classified to the same group of defects, despite the differing defect patterns surrounding the central polygons. In these scenarios, however, neighboring polygons can be taken into consideration by a second-step grouping.

Figure 12:
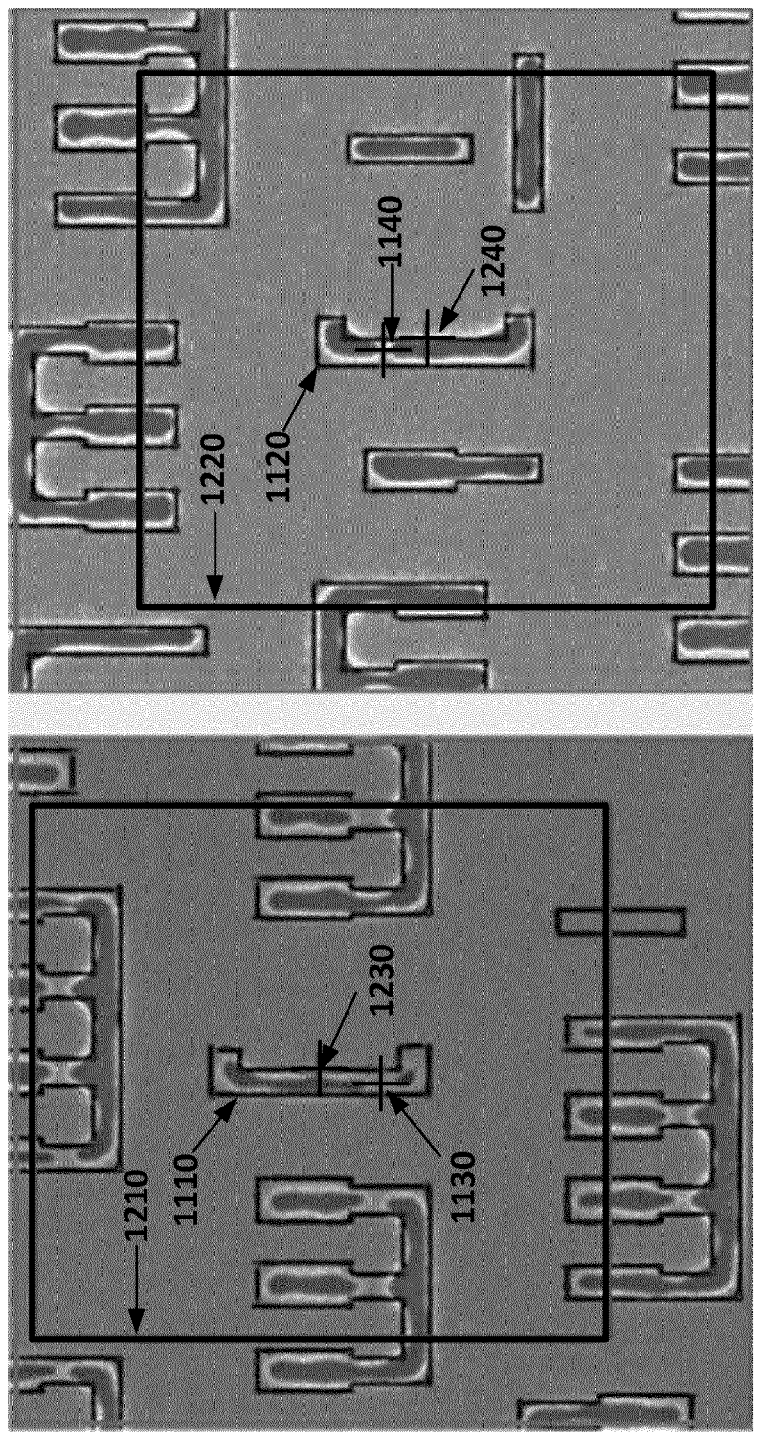
FIG. 12 is a schematic diagram illustrating two exemplary polygons sharing a same structure but different neighboring pattern information to be classified into different groups after second-step grouping, consistent with embodiments of the present disclosure.

Reference is now made to FIG. 12, which is also a schematic diagram illustrating two exemplary polygons 1110 and 1120 sharing a same structure but having different neighboring pattern information. In embodiments using a second-step grouping, polygons 1110 and 1120 are classified into different groups based on their different neighboring pattern information.

After the central-polygon grouping process completes, for each graphic patch of the two images, the original center indicators 1130 and 1140 can remain the same, while a defined window (such as window 1210 of FIG. 12(a) and window 1220 of FIG. 12(b)) is generated to determine the neighboring polygons to use for comparing during the second-step grouping. It is appreciated that the second-step window can also have a second-step center indicator (such as indicators 1230 and 1240) centered over the central polygon.

All polygons or polygon segments within a defined window can be used to do the second-step grouping. For example, in the second-step grouping, the polygons and polygon segments within window 1210 are compared with the polygons and polygon segments within window 1220. The second-step grouping process is the same as the central polygon grouping process (except applied to the neighboring polygons and polygon segments), which is not repeated here. As a result of the second-step grouping process, the two defect patches are put into two different groups instead of one group after the central polygon grouping process. Accordingly, defect patches that are classified into a same group can have better correlation after second-step grouping process, which can save a substantial amount of processing time and determination by the defect review system.

Figure 13:
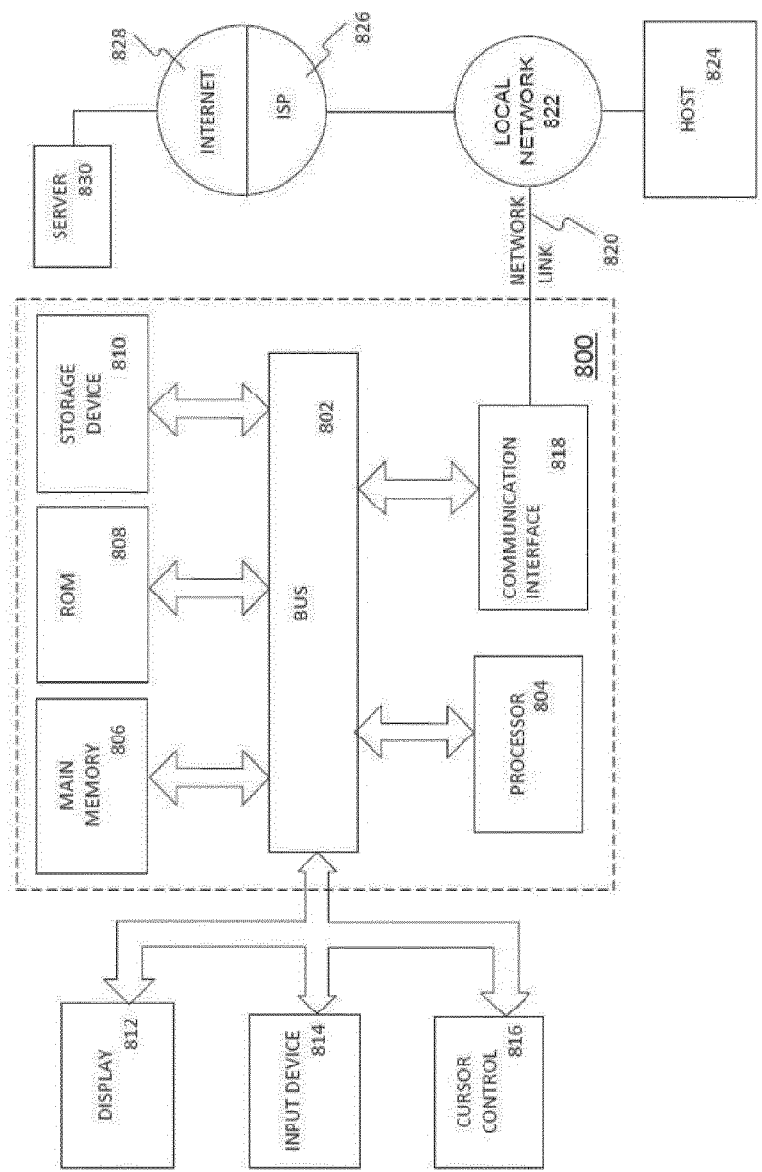
FIG. 13 is a block diagram of an exemplary computer system on which embodiments described herein can be implemented.

Reference is now made to FIG. 13, which is a block diagram of an exemplary computer system on which embodiments described herein can be implemented. At least one of the knowledge recommendation server and the defect classification server described above can be implemented with computer system 800.

Computer system 800 includes a bus 802 or other communication mechanism for communicating information, and one or more hardware processors 804 (denoted as processor 804 for purposes of simplicity; e.g., processor 332 of knowledge recommendation server 330 or processor 324 of defect classification server 320 of FIG. 3) coupled with bus 802 for processing information. Hardware processor 804 can be, for example, one or more microprocessors.

Computer system 800 also includes a main memory 806, such as a random access memory (RAM) or other dynamic storage device, coupled to bus 802 for storing information and instructions to be executed by processor 804. Main memory 806 also can be used for storing temporary variables or other intermediate information during execution of instructions to be executed by processor 804. Such instructions, after being stored in non-transitory storage media accessible to processor 804, render computer system 800 into a special-purpose machine that is customized to perform the operations specified in the instructions.

Computer system 800 further includes a read only memory (ROM) 808 or other static storage device coupled to bus 802 for storing static information and instructions for processor 804. A storage device 810 (e.g., storage device 334 of knowledge recommendation server 330 of FIG. 3), such as a magnetic disk, optical disk, or USB thumb drive (Flash drive), etc., is provided and coupled to bus 802 for storing information and instructions.

Computer system 800 can be coupled via bus 802 to a display 812. An input device 814, including alphanumeric and other keys, is coupled to bus 802 for communicating information and command selections to processor 804. Another type of user input device is cursor control 816.

Computing system 800 can include a user interface module to implement a graphical user interface (GUI) that can be stored in a mass storage device as executable software codes that are executed by the one or more computing devices. This and other modules can include, by way of example, components, such as software components, object-oriented software components, class components and task components, processes, functions, fields, procedures, subroutines, segments of program code, drivers, firmware, microcode, circuitry, data, databases, data structures, tables, arrays, and variables. The modules may include, for example, one or more components of system 300 illustrated in FIG. 3.

Computer system 800 can implement the techniques described herein using customized hard-wired logic, one or more ASICs or FPGAs, firmware and/or program logic which in combination with the computer system causes or programs computer system 800 to be a special-purpose machine. According to some embodiments, the operations, functionalities, and techniques and other features described herein are performed by computer system 800 in response to processor 804 executing one or more sequences of one or more instructions contained in main memory 806. Such instructions can be read into main memory 806 from another storage medium, such as storage device 810. Execution of the sequences of instructions contained in main memory 806 causes processor 804 to perform the method steps (e.g., the processes of FIG. 6, FIG. 8, and/or FIG. 10) described herein. In alternative embodiments, hard-wired circuitry can be used in place of or in combination with software instructions.

The term "non-transitory media" as used herein refers to any non-transitory media storing data and/or instructions that cause a machine to operate in a specific fashion. Such non-transitory media can comprise non-volatile media and/or volatile media. Non-volatile media can include, for example, optical or magnetic disks, such as storage device 810. Volatile media can include dynamic memory, such as main memory 806. Non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, flash memory, register, cache, any other memory chip or cartridge, and networked versions of the same.

Non-transitory media is distinct from, but can be used in conjunction with, transmission media. Transmission media can participate in transferring information between storage media. For example, transmission media can include coaxial cables, copper wire and fiber optics, including the wires that comprise bus 802. Transmission media can also take the form of acoustic or light waves, such as those generated during radio-wave and infra-red data communications.

Various forms of media can be involved in carrying one or more sequences of one or more instructions to processor 804 for execution. For example, the instructions can initially be carried on a magnetic disk or solid state drive of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 can optionally be stored on storage device 810 either before or after execution by processor 804.

Computer system 800 can also include a communication interface 818 coupled to bus 802. Communication interface 818 (e.g., communication interface 322 of defect classification server 320 of FIG. 3 or any communication interface (not shown) of knowledge recommendation server 330) can provide a two-way data communication coupling to a network link 820 that can be connected to a local network 822. For example, communication interface 818 can be an integrated services digital network (ISDN) card, cable modem, satellite modem, or a modem to provide a data communication connection to a corresponding type of telephone line. As another example, communication interface 818 can be a local area network (LAN) card to provide a data communication connection to a compatible LAN. Wireless links can also be implemented. In any such implementation, communication interface 818 can send and receive electrical, electromagnetic or optical signals that carry digital data streams representing various types of information.

Network link 820 can typically provide data communication through one or more networks to other data devices. For example, network link 820 can provide a connection through local network 822 to a host computer 824 or to data equipment operated by an Internet Service Provider (ISP) 826. ISP 826 in turn can provide data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, can be example forms of transmission media.

Computer system 800 can send messages and receive data, including program code, through the network(s), network link 820 and communication interface 818. In the Internet example, a server 830 can transmit a requested code for an application program through Internet 828, ISP 826, local network 822 and communication interface 818.

The received code can be executed by processor 804 as it is received, and/or stored in storage device 810, or other non-volatile storage for later execution. In some embodiments, server 830 can provide information for being displayed on a display.

According to the above disclosed embodiments, a defect review system includes a knowledge recommendation server that can provide recommended knowledge files to a defect classification server which can classify defects by using the knowledge files. Compared to a typical defect review system in which a user needs to visually analyze a newly acquired wafer inspection image, and spent significant time searching for a knowledge file for use in defect classification, the defect review system of the disclosed embodiments can perform the entire defect review process in a real-time scenario, i.e., as soon as wafer inspection images are generated without user intervention. As a result, the throughput of the defect review process is increased.

In addition, the typical defect review system relies on users' experience to select knowledge files for use in defect classification, which may cause inaccurate defect classification results. In contrasts, the knowledge recommendation system of the disclosed embodiments searches for knowledge files based on defect feature parameters exacted from defect patch image, which can generate more accurate results.

The embodiments may further be described using the following clauses:

1. A defect pattern grouping method comprising,
    obtaining a first polygon that represents a first defect from an image of a sample;
    comparing the first polygon with a set of one or more representative polygons of a defect-pattern collection; and
    grouping the first polygon with any one or more representative polygons identified based on the comparison.
2. The defect pattern grouping method of clause 1, further comprising:
    acquiring the set of one or more representative polygons having a polygon pattern that is similar to a pattern of the first polygon.
3. The defect pattern grouping method of clause 2, further comprising:
    designating the first polygon and the acquired set of one or more representative polygons as central polygons.
4. The defect pattern grouping method of clause 3, further comprising:
    comparing neighboring polygon information of the central polygons.
5. The defect pattern grouping method of clause 4, wherein the neighboring polygon information includes topological characteristics of one or more neighboring polygon patterns surrounding the central polygons.
6. The defect pattern grouping method of clause 2, further comprising:
    acquiring the set of one or more representative polygons having one or more topological characteristics that are similar to one or more topological characteristics of the first polygon.
7. The defect pattern grouping method of clause 2, wherein comparing the first polygon with a set of one or more representative polygons of a defect-pattern collection further comprises determining a similarity between the first polygon and the set of one or more representative polygons of a defect-pattern collection.
8. The defect pattern grouping method of clause 7, wherein determining the similarity between the first polygon and the set of one or more representative polygons of a defect-pattern collection further comprises,
    aligning the polygon pattern of the first defect with the polygon pattern of one of the set of one or more representative polygons of a defect-pattern collection; and
    determining the similarity based on the alignment.
9. The defect pattern grouping method of any one of clauses 7 and 8, further comprising,
    grouping the first polygon with any one or more acquired representative polygons, in response to the similarity being greater than a preset similarity threshold.
10. The defect pattern grouping method of any one of clauses 7 and 8, further comprising,
    grouping the first polygon as a representative polygon of a defect pattern, in response to the similarity not being greater than a preset similarity threshold.
11. A non-transitory computer readable medium storing a set of instructions that is executable by one or more processors of a defect classification server to cause the server to perform a method comprising,
    obtaining a first polygon that represents a first defect from an image of a sample;
    comparing the first polygon with a set of one or more representative polygons of a defect-pattern collection; and grouping the first polygon with any one or more representative polygons identified based on the comparison.

12. The non-transitory computer readable medium of clause 11, wherein the set of instructions to cause the server to further perform:

acquiring the set of one or more representative polygons having a polygon pattern that is similar to a pattern of the first polygon.

13. The non-transitory computer readable medium of clause 12, wherein the set of instructions to cause the server to further perform:

designating the first polygon and the acquired set of one or more representative polygons as central polygons.

14. The non-transitory computer readable medium of clause 12, wherein the set of instructions to cause the server to further perform:

comparing neighboring polygon information of the central polygons.

15. The non-transitory computer readable medium of clause 13, wherein the neighboring polygon information includes topological characteristics of one or more neighboring polygon patterns surrounding the central polygons.

16. The non-transitory computer readable medium of clause 14, wherein the set of instructions to cause the server to further perform:

acquiring the set of one or more representative polygons having one or more topological characteristics that are similar to one or more topological characteristics of the first polygon.

17. The non-transitory computer readable medium of clause 12, wherein comparing the first polygon with a set of one or more representative polygons of a defect-pattern collection further comprises determining a similarity between the first polygon and the set of one or more representative polygons of a defect-pattern collection.

18. The non-transitory computer readable medium of clause 17, wherein determining the similarity between the first polygon and the set of one or more representative polygons of a defect-pattern collection further comprises, aligning the polygon pattern of the first defect with the polygon pattern of one of the set of one or more representative polygons of a defect-pattern collection; and determining the similarity based on the alignment.

19. The non-transitory computer readable medium of any one of clauses 17 and 18, the set of instructions to cause the server to further perform:

grouping the first polygon with any one or more acquired representative polygons, in response to the similarity being greater than a preset similarity threshold.

20. The non-transitory computer readable medium of any one of clauses 17 and 18, the set of instructions to cause the server to further perform:

grouping the first polygon as a representative polygon of a defect pattern, in response to the similarity not being greater than a preset similarity threshold.

21. A defect pattern grouping system comprising:
a memory configured to store a set of instructions; and,
a processor configured to execute the set of instructions to cause the defect pattern grouping system to:
obtain a first polygon that represents a first defect from an image of a sample;
compare the first polygon with a set of one or more representative polygons of a defect-pattern collection; and
group the first polygon with any one or more representative polygons identified based on the comparison.

22. The defect pattern grouping system of clause 21, wherein the processor is configured to execute the set of instructions to further cause the defect pattern grouping system to:

acquire the set of one or more representative polygons having a polygon pattern that is similar to a pattern of the first polygon.

23. The defect pattern grouping system of clause 22, wherein the processor is configured to execute the set of instructions to further cause the defect pattern grouping system to:

designate the first polygon and the acquired set of one or more representative polygons as central polygons.

24. The defect pattern grouping system of clause 23, wherein the processor is configured to execute the set of instructions to further cause the defect pattern grouping system to:

compare neighboring polygon information of the central polygons.

25. The defect pattern grouping system of clause 24, wherein the neighboring polygon information includes topological characteristics of one or more neighboring polygon patterns surrounding the central polygons.

26. The defect pattern grouping system of clause 22, wherein the processor is configured to execute the set of instructions to further cause the defect pattern grouping system to:

acquire the set of one or more representative polygons having one or more topological characteristics that are similar to one or more topological characteristics of the first polygon.

27. The defect pattern grouping system of clause 22, wherein the comparison of the first polygon with a set of one or more representative polygons of a defect-pattern collection further comprises a determination of a similarity between the first polygon and the set of one or more representative polygons of a defect-pattern collection.

28. The defect pattern grouping system of clause 27, wherein the determination of the similarity between the first polygon and the set of one or more representative polygons of a defect-pattern collection further comprises, an alignment of the polygon pattern of the first defect with the polygon pattern of one of the set of one or more representative polygons of a defect-pattern collection; and a determination of the similarity based on the alignment.

29. The defect pattern grouping system of any one of clauses 27 and 28, wherein the processor is configured to execute the set of instructions to further cause the defect pattern grouping system to:

group the first polygon with any one or more acquired representative polygons, in response to the similarity being greater than a preset similarity threshold.

30. The defect pattern grouping system of any one of clauses 27 and 28, wherein the processor is configured to execute the set of instructions to further cause the defect pattern grouping system to:

group the first polygon as a representative polygon of a defect pattern, in response to the similarity not being greater than a preset similarity threshold.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A defect pattern grouping method comprising:
identifying a first polygon that represents a first defect and a second polygon that represents a second defect based on an image of a sample;
comparing the first polygon and the second polygon with a set of one or more representative polygons of a defect-pattern collection; and
grouping the first polygon and the second polygon based on the comparison, the grouping further comprising:
in response to the comparison indicating that the first polygon is similar to any one of the set of one or more representative polygons,
comparing neighboring polygon information of the first polygon and the set of one or more representative polygons;
grouping the first polygon and the set of one or more representative polygons into different secondary groups in response to the neighboring polygon information of the first polygon and the set of one or more representative polygons being different; and
grouping the first polygon into a same group of defects represented by the set of one or more representative polygons in response to the neighboring polygon information of the first polygon and the set of one or more representative polygons being the same; and
in response to the comparison indicating that the second polygon is different from any one of the set of one or more representative polygons, grouping the second polygon into a new group of defects represented by the second polygon.

2. The defect pattern grouping method of claim 1, further comprising:
acquiring the set of one or more representative polygons, wherein polygons of the set of one or more representative polygons have a polygon pattern that is similar to a pattern of the first polygon.

3. The defect pattern grouping method of claim 2, further comprising:
designating the first polygon and the acquired set of one or more representative polygons as central polygons.

4. The defect pattern grouping method of claim 2, further comprising:
acquiring the set of one or more representative polygons, wherein polygons of the set of one or more representative polygons have one or more topological characteristics that are similar to one or more topological characteristics of the first polygon.

5. The defect pattern grouping method of claim 2, wherein comparing the first polygon with a set of one or more representative polygons of a defect-pattern collection further comprises determining a similarity between the first polygon and the set of one or more representative polygons of a defect-pattern collection.

6. The defect pattern grouping method of claim 5, wherein determining the similarity between the first polygon and the set of one or more representative polygons of a defect-pattern collection further comprises:
aligning a polygon pattern of the first polygon representing the first defect with a polygon pattern of one of the set of one or more representative polygons of a defect-pattern collection; and
determining the similarity based on the alignment.

7. The defect pattern grouping method of claim 6, further comprising:
grouping the first polygon with the one or more acquired representative polygons, in response to the similarity being greater than a preset similarity threshold.

8. The defect pattern grouping method of claim 1, wherein comparing the second polygon with a set of one or more representative polygons of a defect-pattern collection further comprises:
determining a similarity between the second polygon and the set of one or more representative polygons of a defect-pattern collection, the determining further comprising:
aligning a polygon pattern of the second defect with a polygon pattern of one of the set of one or more representative polygons of a defect-pattern collection; and
determining the similarity based on the alignment; and
grouping the second polygon into the new group of defects and identifying the second polygon as a representative polygon of a defect pattern of the new group of defects, in response to the similarity not being greater than a preset similarity threshold.

9. A defect pattern grouping system comprising:
a memory configured to store a set of instructions; and,
one or more processors configured to execute the set of instructions to cause the defect pattern grouping system to:
identify a first polygon that represents a first defect and a second polygon that represents a second defect based on an image of a sample;
compare the first polygon and the second polygon with a set of one or more representative polygons of a defect-pattern collection; and
group the first polygon and the second polygon based on the comparison, wherein the one or more processors are configured to execute the set of instructions to further cause the defect pattern grouping system to:
in response to the comparison indicating that the first polygon is similar to any one of the set of one or more representative polygons,
compare neighboring polygon information of the first polygon and the set of one or more representative polygons;
group the first polygon and the set of one or more representative polygons into different secondary groups in response to the neighboring polygon information of the first polygon and the set of one or more representative polygons being different; and
group the first polygon into a same group of defects represented by the set of one or more representative polygons in response to the neighboring polygon information of the first polygon and the set of one or more representative polygons being the same; and
group the second polygon into a new group of defects represented by the second polygon in response to the comparison indicating that the second polygon is different from any one of the set of one or more representative polygons.

10. The defect pattern grouping system of claim 9, wherein the one or more processors are configured to execute the set of instructions to further cause the defect pattern grouping system to:
acquire the set of one or more representative polygons, wherein polygons of the set of one or more representative polygons have a polygon pattern that is similar to a pattern of the first polygon; and
designate the first polygon and the acquired set of one or more representative polygons as central polygons.

11. The defect pattern grouping system of claim 10, wherein the one or more processors are configured to execute the set of instructions to further cause the defect pattern grouping system to:
acquire the set of one or more representative polygons, wherein polygons of the set of one or more representative polygons have one or more topological characteristics that are similar to one or more topological characteristics of the first polygon.

12. The defect pattern grouping system of claim 10, wherein the one or more processors are configured to execute the set of instructions to further cause the defect pattern grouping system to:
determine a similarity between the first polygon and the set of one or more representative polygons of a defect-pattern collection.

13. The defect pattern grouping system of claim 12, wherein the one or more processors are configured to execute the set of instructions to further cause the defect pattern grouping system to:
group the first polygon with the one or more acquired representative polygons, in response to the similarity being greater than a preset similarity threshold.

14. The defect pattern grouping method of claim 3, wherein the neighboring polygon information includes topological characteristics of one or more neighboring polygon patterns surrounding the central polygons.

15. The defect pattern grouping system of claim 12, wherein the one or more processors are configured to execute the set of instructions to further cause the defect pattern grouping system to:
align a polygon pattern of the first polygon representing the first defect with a polygon pattern of one of the set of one or more representative polygons of a defect-pattern collection; and
determine the similarity based on the alignment.

16. The defect pattern grouping system of claim 10, wherein the neighboring polygon information includes topological characteristics of one or more neighboring polygon patterns surrounding the central polygons.

17. The defect pattern grouping system of claim 10, wherein the one or more processors are configured to execute the set of instructions to further cause the defect pattern grouping system to:
determine a similarity between the second polygon and the set of one or more representative polygons of a defect-pattern collection, wherein the one or more processors are configured to execute the set of instructions to further cause the defect pattern grouping system to:
align a polygon pattern of the second defect with a polygon pattern of one of the set of one or more representative polygons of a defect-pattern collection; and
determine the similarity based on the alignment; and
group the second polygon into the new group of defects and identifying the second polygon as a representative polygon of a defect pattern of the new group of defects, in response to the similarity not being greater than a preset similarity threshold.

18. A non-transitory computer readable medium that stores a set of instructions that is executable by one or more processors of a computing device to cause the computing device to perform a defect pattern grouping method, the method comprising:
identifying a first polygon that represents a first defect and a second polygon that represents a second defect based on an image of a sample;
comparing the first polygon and the second polygon with a set of one or more representative polygons of a defect-pattern collection; and
grouping the first polygon and the second polygon based on the comparison, the grouping further comprising:
in response to the comparison indicating that the first polygon is similar to any one of the set of one or more representative polygons,
comparing neighboring polygon information of the first polygon and the set of one or more representative polygons;
grouping the first polygon and the set of one or more representative polygons into different secondary groups in response to the neighboring polygon information of the first polygon and the set of one or more representative polygons being different; and
grouping the first polygon into a same group of defects represented by the set of one or more representative polygons in response to the neighboring polygon information of the first polygon and the set of one or more representative polygons being the same; and
in response to the comparison indicating that the second polygon is different from any one of the set of one or more representative polygons, grouping the second polygon into a new group of defects represented by the second polygon.

* * * * *